United States Patent [19]

Ishimaru

[11] Patent Number: 5,496,744
[45] Date of Patent: Mar. 5, 1996

[54] METHOD OF FABRICATING COMPLEMENTARY POLY EMITTER TRANSISTORS

[75] Inventor: Kazunari Ishimaru, Yokohama, Japan

[73] Assignee: Kabushiki Kaisha Toshiba, Kawasaki, Japan

[21] Appl. No.: 338,691

[22] Filed: Nov. 14, 1994

[30] Foreign Application Priority Data

Nov. 15, 1993 [JP] Japan .................... 5-284781

[51] Int. Cl.$^6$ ............................... H01L 21/265
[52] U.S. Cl. .................. 437/31; 437/46; 437/152; 437/160; 437/162; 437/186; 437/193; 148/DIG. 10; 148/DIG. 11; 148/DIG. 18; 148/DIG. 122; 148/DIG. 123; 148/DIG. 124
[58] Field of Search ................. 437/31, 152, 160, 437/162, 46, 193, 186; 148/DIG. 10, DIG. 11, DIG. 123, DIG. 124, DIG. 122, DIG. 18; 257/511, 512, 525, 555, 569, 574

[56] References Cited

U.S. PATENT DOCUMENTS

| | | | |
|---|---|---|---|
| 4,063,967 | 12/1977 | Graul et al. | 437/46 |
| 4,546,536 | 10/1985 | Anantha et al. | 257/511 |
| 5,013,677 | 5/1991 | Hozumi | 437/31 |
| 5,116,770 | 5/1992 | Kameyama et al. | 437/31 |
| 5,236,851 | 8/1993 | Kameyama et al. | 437/46 |
| 5,244,835 | 9/1993 | Hachiya | 437/162 |
| 5,296,388 | 3/1994 | Kameyama et al. | 437/162 |

FOREIGN PATENT DOCUMENTS

| | | | |
|---|---|---|---|
| 0021820 | 2/1983 | Japan | 437/46 |
| 0065671 | 3/1988 | Japan | 437/46 |
| 9306622 | 9/1992 | WIPO | 257/555 |

*Primary Examiner*—George Fourson
*Assistant Examiner*—Long Pham
*Attorney, Agent, or Firm*—Loeb and Loeb

[57] ABSTRACT

In a method of manufacturing a bipolar transistor by forming emitter regions of PNP and NPN transistors with diffusion of impurity from the polycrystalline silicon film into the substrate, the B-doped polycrystalline silicon film is deposited on the interlayer insulating film in which the emitter holes of the PNP and NPN transistors are made. Further, the interlayer insulating film is deposited on this film, and the portion of the insulating film which situated on the NPN transistor region is removed. Then, the thermal treatment is carried out in a high-concentration P atmosphere, so as to change the portion of the film which is located on the NPN transistor region to a P-doped polycrystalline silicon film. With this thermal treatment, the P-type and N-type emitter diffusion regions are formed on the base regions of the PNP and NPN transistors. According to the manufacturing method, the emitter regions have a uniform impurity concentration in an appropriate shape, thus reducing the variation and degradation of the characteristics of the device due to downsizing.

5 Claims, 4 Drawing Sheets

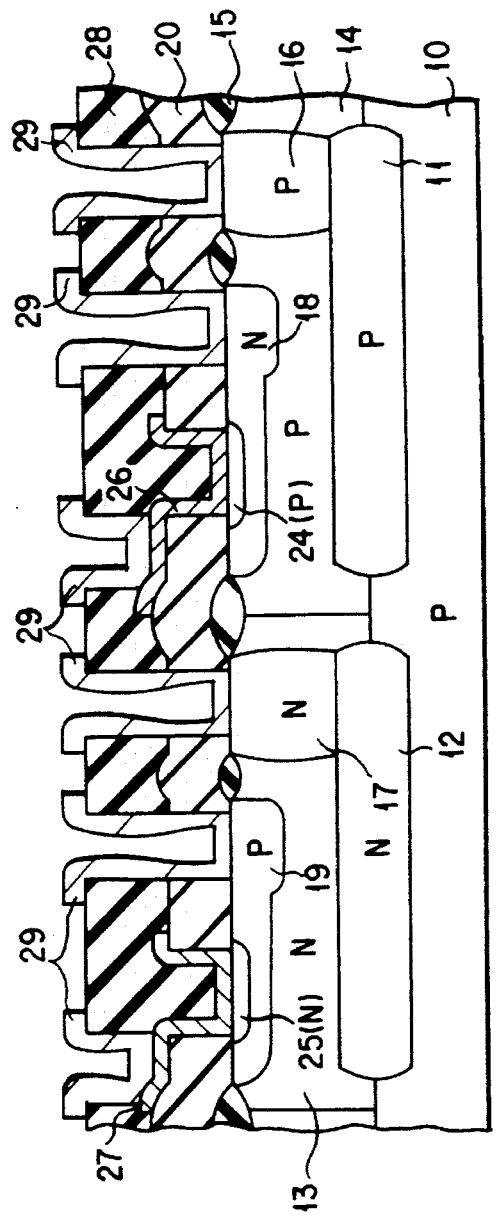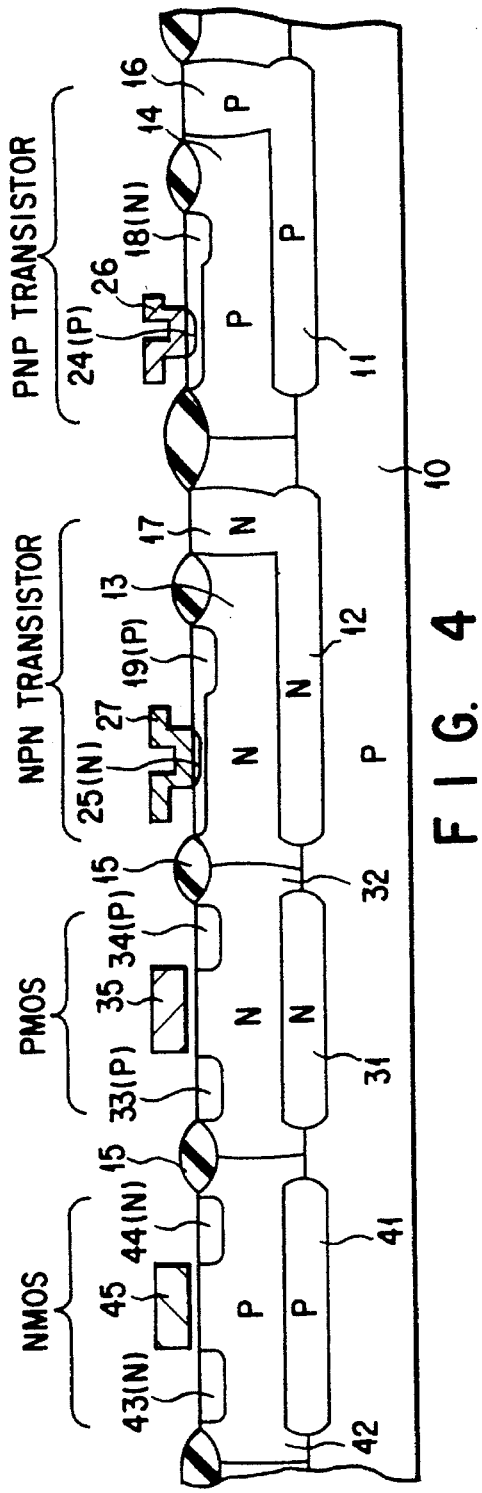

METHOD OF FABRICATING COMPLEMENTARY POLY EMITTER TRANSISTORS

BACKGROUND OF THE INVENTION

1. Field of the Invention

The present invention relates to a method of manufacturing a semiconductor device having a structure in which, for example, a PNP transistor and an NPN transistor are formed on a semiconductor substrate, and more specifically to a method of manufacturing a so-called polycrystalline silicon emitter transistor (poly emitter transistor), in which an emitter region of a bipolar transistor is formed by diffusion of an impurity from the polycrystalline silicon film into the substrate.

2. Description of the Related Art

Conventionally, in a so-called poly emitter transistor, in which an emitter region of a bipolar transistor is formed by diffusing impurities from the polycrystalline silicon film into the substrate, the ion implantation method is generally used for the introduction of an impurity into the polycrystalline silicon film.

Examples of the impurity introduced by the ion implantation method are arsenic, in the case of an NPN transistor, and boron (B) or boron difluoride (BF$_2$) in the case of a PNP transistor.

As the size of a bipolar transistor is decreased in the downsizing trend, the width of its emitter region is also reduced. Along with this, the aspect ratio of the emitter hole (height of emitter hole with respect to the width of emitter) is increased.

FIGS. 1A and 1B are diagrams showing the case where an impurity 4 is introduced by ion implantation into a polycrystalline silicon film 3 deposited on an insulating film 2 formed on a semiconductor substrate 1 in the process of manufacturing a bipolar transistor.

In this case, if the aspect ratio of an emitter hole 5 made in the insulating film 2 is large, a section where the impurity 4 is not introduced during the ion implantation, is created in the side wall portion of the emitter hole 5, as shown in FIG. 1A, or in the polycrystalline silicon film 3 of the deepest section as shown in FIG. 1B.

As a result, the concentration of the impurity in the polycrystalline silicon film 3 is not uniformed as shown in FIG. 2, and consequently, thus formed emitter region 6 has a distorted shape. Therefore, a non-uniformity of the characteristics of the bipolar results, or the characteristics are degraded.

In order to solve this problem, there has been an attempt in which a polycrystalline silicon film in which an impurity has been doped in advance is deposited. For example, in the case of an NPN transistor, such an attempt is the method of depositing a polycrystalline silicon film in which phosphor has been doped.

With this method, however, only one of two conduction types of polycrystalline silicon film can be deposited.

When emitter regions having conduction types different from each other are formed by diffusing an impurity from the polycrystalline film so as to manufacture an NPN transistor and a PNP transistor at the same time, there is only one possible method of introducing an impurity, and that is the ion implantation method. With the ion implantation method, however, the variance of the characteristics of the transistors due to the downsizing thereof is not inevitable, creating a problem.

SUMMARY OF THE INVENTION

The object of the present invention is to provide a method of manufacturing a semiconductor device, which can form at the same time, two types of semiconductor regions having different conduction types, each in an appropriate shape, thus preventing the variation and degradation of the characteristics of transistors, caused by downsizing.

In order to achieve the above object, there is proposed, according to the present invention, a method of manufacturing a semiconductor device, comprising the steps of: forming a first insulating film on a semiconductor substrate; making at least first and second holes by selectively removing part of the first insulating film; forming a conductive film containing an impurity of a first conduction type, on the first insulation layer having the holes made thereon; forming a second insulating film on the conductor film; exposing a predetermined portion of the conductor film which includes the second hole of the first and second holes, by selectively removing the second insulating film; changing the exposed portion of the conductive film to a second conduction type, by diffusion of an impurity of the second conduction type; and forming a semiconductor region of the first conduction type and a semiconductor region of the second conduction type at the same time in a surface region of the semiconductor substrate, by diffusing the impurity of the first conduction type and the impurity of the second conduction type into the semiconductor substrate through the first and second opening formed in the insulating film.

According to the present invention, there is also proposed a method of manufacturing a semiconductor device, comprising the steps of: selectively forming a collector region of a second conduction type in a first element region of a semiconductor substrate of a first conduction type, and a collector region of a second conduction type in a second element region thereof; forming a base region of the second conduction type in the first element region on the semiconductor substrate, in which the collector region of the first conduction type is formed, and a base region of the first conduction type in the second element region in which the collector region of the second conduction type is formed; forming a first insulating film on the semiconductor substrate; forming emitter contact holes in portions of the first insulating film which correspond to an emitter region of the first conduction type formed in the first element region, and an emitter region of the second conduction type formed in the second element region; forming a conductor film containing an impurity of the first conduction type, on the first insulating film having the holes therein; forming a second insulating film on the conductor film; exposing a portion of the conductor film which corresponds to a second element region in which the emitter region of the second conduction type is formed, by selectively removing the second insulating film; performing a thermal treatment and diffusion of the impurity of the second conduction type while the portion of the conductor film is exposed, so as to change the impurity of the first conduction type contained in the exposed portion of the conductor film to an impurity of a second conduction type, and diffuse the impurity changed to the second conduction type into a surface region of the semiconductor substrate via the hole formed in the portion of the first insulating film which corresponds to the emitter region formed in the second element region, thereby forming the emitter region of the second conduction type in the second element region, and diffuse the impurity of the first conduction type contained in the non-exposed portion of the conductor film into the surface region of the semiconductor substrate via the hole formed in the portion of the first insulating film which corresponds to the emitter region formed in the first element region, thereby forming the emitter region of the second conduction type in the first element region.

According to the present invention, impurity can be uniformly doped by the above-described means even in the case where the width of a semiconductor region to be formed is small, and therefore the formation of the semiconductor region by the diffusion of impurity can be stably carried out.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3G are cross sections each illustrating a step in the method of manufacturing a semiconductor device, according to the present invention; and FIG. 4 is a diagram showing a cross section of a semiconductor manufactured by the present invention method.

DETAILED DESCRIPTION OF THE PREFERRED EMBODIMENTS

An embodiment of the present invention will now be described with reference to drawings.

FIGS. 3A to 3G are schematic diagrams illustrating steps in the process of manufacturing a bipolar transistor, according to the present invention.

Figure 1A:
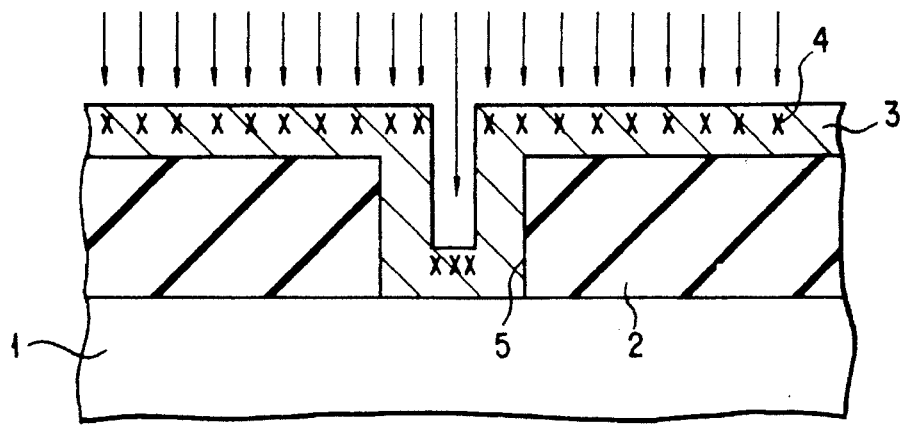
FIGS. 1A and 1B are diagrams showing a cross section of a semiconductor device, which illustrates the distribution state of an impurity in the case where an ion implantation is carried out.
Figure 1B:
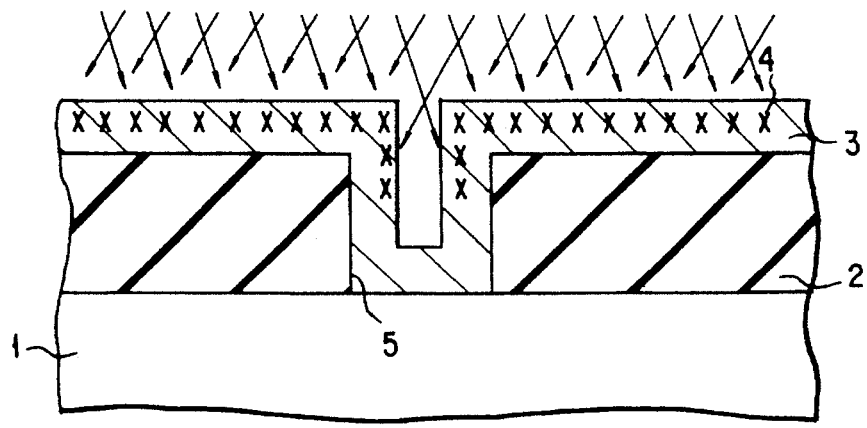
Figure 2:
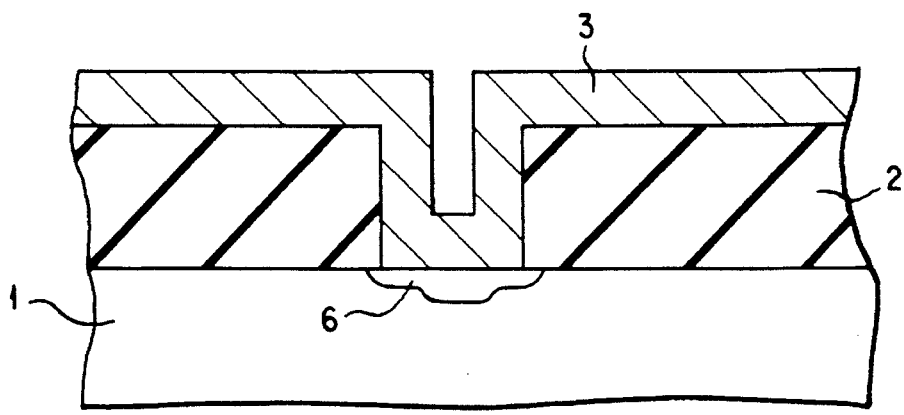
FIG. 2 is a diagram of the same cross section as those shown in FIGS. 1A and 1B, which illustrates, in particular, an impurity diffusion region formed by the impurity added by the ion implantation.
Figure 3A:
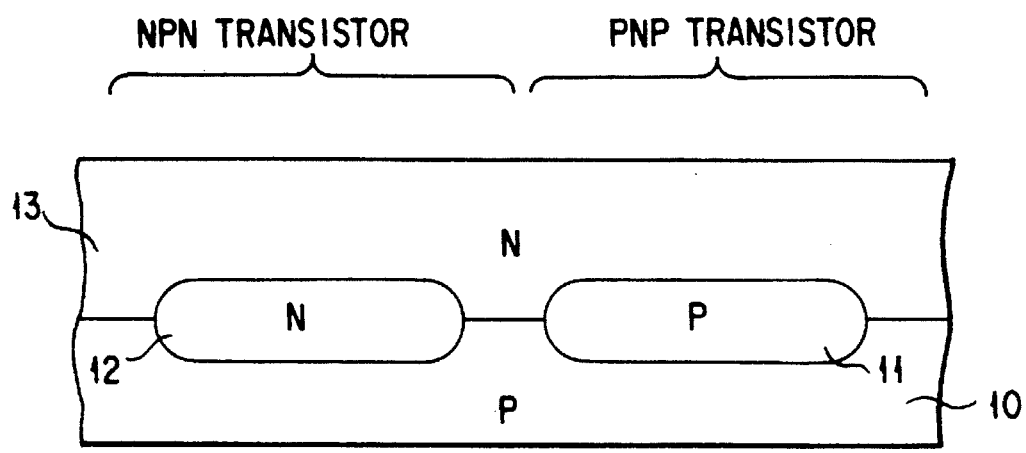

As can be seen in FIG. 3A, P-type and N-type buried collector regions 11 and 12 for a PNP transistor and an NPN transistor, respectively, are formed on a P-type silicon (Si) substrate having a resistivity of 4 to 6Ω·cm by a solid phase diffusion method or an ion implantation method.

Next, an N-type epitaxial layer 13 having a concentration of, for example, $5 \times 10^{15}$ cm$^{-3}$ to $5 \times 10^{16}$ cm$^{-3}$, is grown to have a thickness of about 0.5 to 1.5 μm on the silicon substrate 10 by an epitaxial growth method.

Figure 3B:
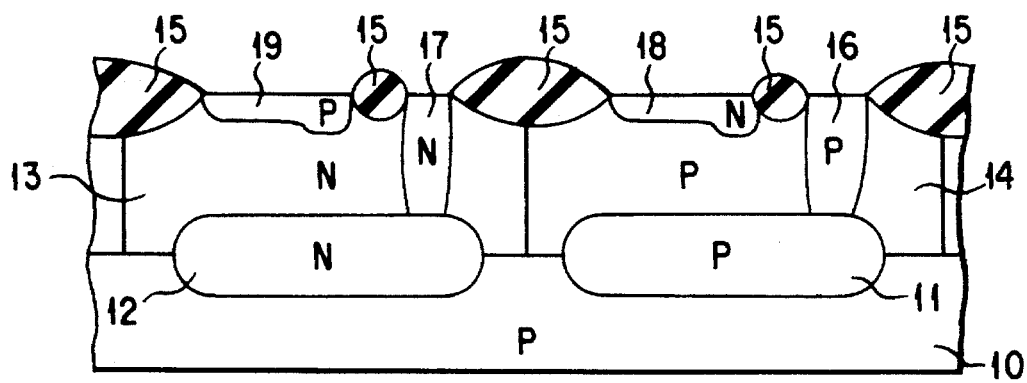

Then, as can be seen in FIG. 3B, after a collector region 14 of the PNP transistor is formed by a selective ion implantation method, an element separation region 15 is selectively formed by a selective oxidation method.

In this case, the N-type epitaxial layer 13 of the NPN transistor region remains as it is, and serves as a collector region of the NPN transistor.

After that, P-type and N-type leading regions 16 and 17 from the buried collector regions 11 and 12 are formed by the selective implantation method.

Further, base regions 18 and 19 of the transistors are selectively formed by the selective ion implantation method.

The implantation is carried out under the following conditions. That is, boron (B) or boron difluoride (BF$_2$) is implanted to the base region of the NPN transistor at an accelerating voltage of 10 to 50 keV for about $1 \times 10^{13}$ cm$^2$ to $1 \times 10^{14}$ cm$^2$.

Further, phosphorus (P) or arsenic (As) is implanted to the base region of the NPN transistor at an accelerating voltage of 20 to 100 keV for about $1 \times 10^{13}$ cm$^2$ to $1 \times 10^{14}$ cm$^2$.

Figure 3C:
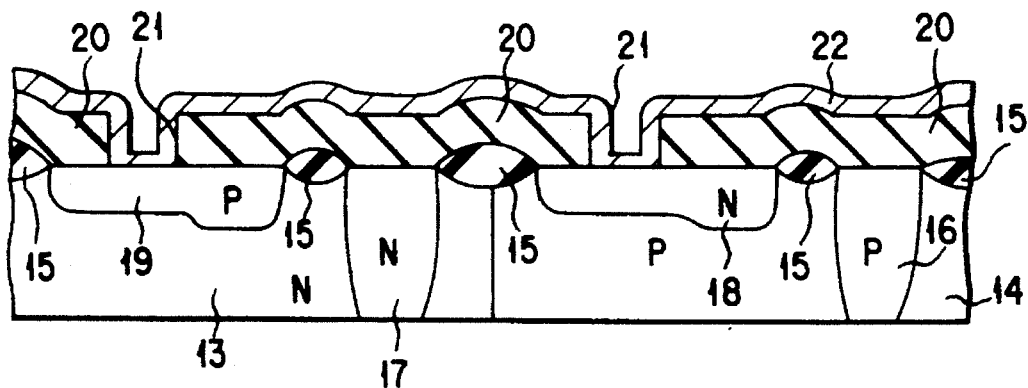

Subsequently, as can be seen in FIG. 3C, an interlayer insulating film 20 is deposited to have a thickness of about 300 nm on the epitaxial layer 13 by a chemical vapor deposition (CVD) method. The interlayer insulating film 20 may be a single-layered film made of a silicon oxide (SiO$_2$) film or a multi-layered film including an SiO$_2$ and SiO$_2$ film containing boron (B) or phosphorus (P).

The interlayer insulating film 20 is, if necessary, flattened by the conventional method, and then an emitter contact hole (emitter hole) 21 is selectively made by the selective etching method.

Subsequently, for example, a B-doped polycrystalline silicon film 22, in which B is uniformly doped at a concentration of $1 \times 10^{20}$ cm$^{-3}$ to $1 \times 10^{21}$ cm$^{-3}$, is deposited on the interlayer insulating film 20 to have a thickness of about 50 to 200 nm by the CVD method.

It should be noted that the B-doped polycrystalline silicon film 22 deposited may not be polycrystalline but may be amorphous.

Figure 3D:
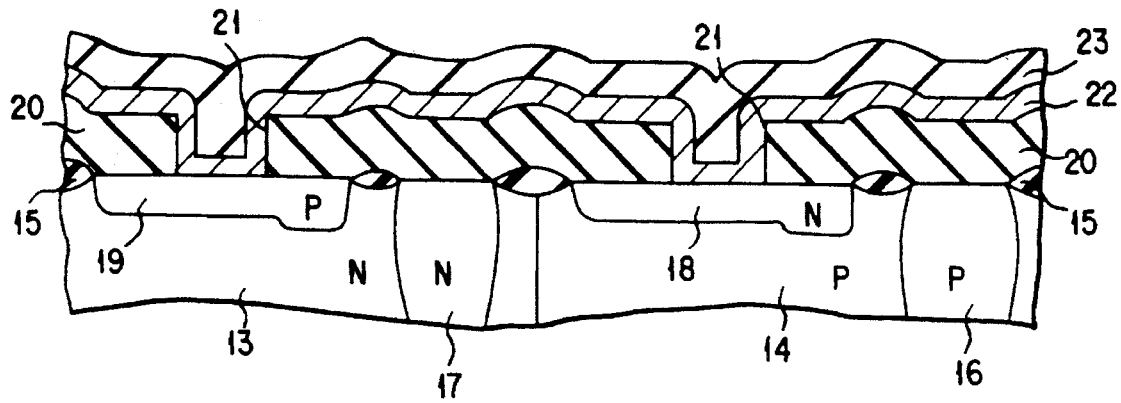

Next, as can be seen in FIG. 3D, an interlayer insulating film 23 is deposited on the B-doped polycrystalline silicon film 22 by the CVD method. This interlayer insulating film 23 may be of an arbitrary type as long as it has a property of blocking the diffusion of impurity, and examples thereof are SiO$_2$ film and silicon nitride (SiN) film.

Figure 3E:
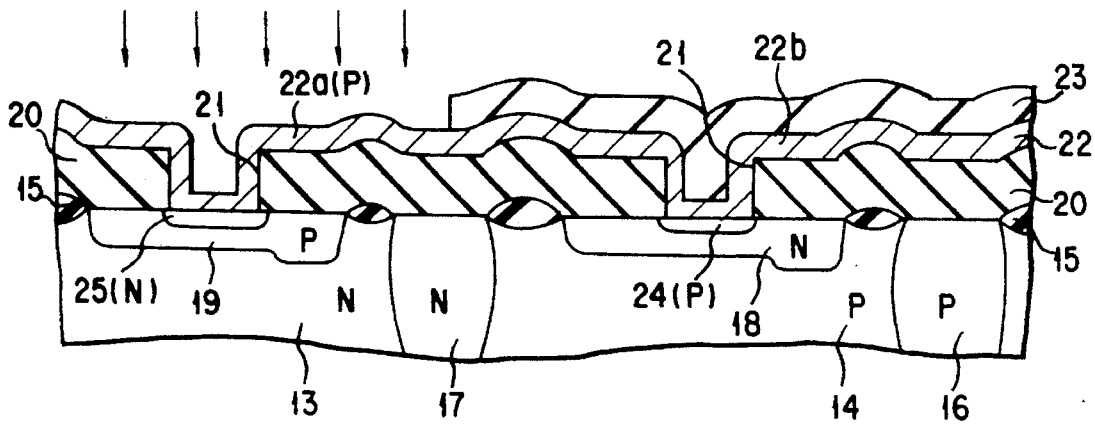

Then, the deposited interlayer insulating film 23 is selectively removed by a selective etching method, and as shown in FIG. 3E, that portion of the interlayer insulating film 23 which is situated above the NPN transistor region is removed so as to expose a portion 22a of the B-doped polycrystalline film 22 in the NPN transistor region. However, that portion of the interlayer insulating film 23 which is situated on the portion 22b of the polycrystalline silicon film 22 in the PNP transistor region is preserved, and therefore the portion 22b of the polycrystalline silicon in the PNP transistor region is not exposed.

In short, in the case of this embodiment, the portion of the interlayer insulating film 23 in the NPN transistor region is removed, whereas the portion of the interlayer insulating film 23 is preserved on the PNP transistor region.

The semiconductor structure of this stage is subjected to a thermal treatment in an atmosphere containing phosphorus at a high concentration. Thus, phosphorus is uniformly doped in the portion 22a of the B-doped polycrystalline silicon film 22 in the NPN transistor region, and the portion 22a of the B-doped polycrystalline silicon film 22 is changed to the P-doped polycrystalline silicon film. The portion 22b of the polycrystalline silicon film 22 in the PNP transistor region is masked by that portion of the interlayer insulating film 23 which remains on the portion 22b, and therefore the portion 22b is preserved as being the B-doped polycrystalline, and is not changed to the P-doped polycrystalline.

Further, as can be seen in FIG. 3E, due to the thermal treatment, P-type and N-type emitter diffusion regions 24 and 25 are formed respectively in surface regions of the base regions 18 and 19 of the PNP transistor and the NPN transistor. More specifically, the emitter diffusion regions 24 and 25 are formed at the same time in a step of changing the portion 22a of the B-doped polycrystalline silicon film to the P-doped polycrystalline silicon film, that is, the formation of these regions is carried out in one step.

In more detail, in the PNP transistor region, boron uniformly doped in the portion 22b of the B-doped polycrystalline silicon film 22 is diffused by the thermal treatment, and thus the emitter diffusion region 24 having a uniform impurity concentration and an appropriate shape, is formed in the surface region of the base region 18.

In the NPN transistor region, phosphorus uniformly doped in the portion 22a of the polycrystalline silicon film 22 is diffused in the surface region of the base region 19 by the thermal treatment in a phosphorus atmosphere, and thus the emitter diffusion region 25 having a uniform impurity concentration and an appropriate shape, is formed.

Apart from the above-described thermal treatment in a phosphorus atmosphere, a so-called solid phase diffusion method in which, for example, an SiO_2 film containing P at a high concentration is deposited on the exposed portion 22a of the B-doped polycrystalline silicon film by the CVD method, and then subjected to a thermal treatment while maintaining such a state, can be used in order to change the portion 22a of the B-doped polycrystalline silicon film to the P-doped polycrystalline silicon film.

Figure 3F:
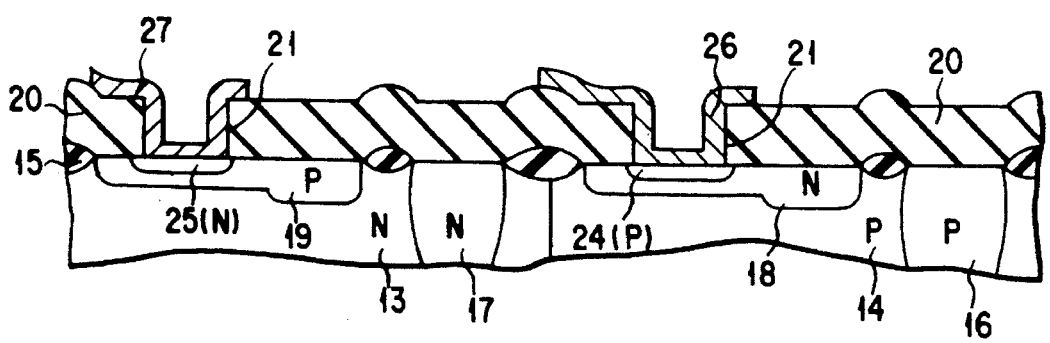

Next, that portion of the interlayer insulating film 23 which remains on the PNP transistor region is removed by the known etching method, and then the silicon film 22 is selectively etched by a photolithography technique and anisotropic etching technique, thus selectively forming electrodes 26 and 27 for leading out emitters as shown in FIG. 3F.

After that, as can be seen in FIG. 3G, an interlayer insulating film 28 is deposited by the CVD method, and contact holes are selectively made in the interlayer insulating film 28 by the selective etching method. Then, a wiring layer 29 is formed such as to extend into each contact hole by the known method, thus completing a bipolar transistor having a structure, whose cross section is shown in FIG. 3G.

AS described above, in this embodiment, the part 22a of the B-doped polycrystalline silicon film 22 is changed to the P-doped polycrystalline silicon film 22a, and therefore each of the concentrations of impurity in the portions 22a and 22b of the polycrystalline silicon film can be made uniform. Consequently, the P-type and N-type emitter diffusion regions 24 and 25, which are formed by the diffusion of impurity, can be made into appropriate shapes each having a uniform impurity concentration. Therefore, even in the case where the widths of these emitter diffusion regions are small, the emitter diffusion regions can be stably formed. Thus, the variation and the degradation of the characteristics of the bipolar transistor due to the downsizing thereof can be significantly reduced.

Further, the emitter diffusion regions of the PNP transistor and the NPN transistor can be formed at the same time by using the same polycrystalline silicon film, and therefore two photolithography steps are no longer necessary, thus making it possible to reduce the number of steps and the production cost, as compared to the conventional method in which the doping with impurity is carried out by the ion implantation.

In the above-described embodiment, after the B-doped polycrystalline silicon film 22 is deposited, phosphorus is diffused into that portion 22a of the silicon film 22 which corresponds to the NPN transistor. However, the present invention is not limited to such an embodiment. A similar effect can be obtained in the case where boron is diffused into that portion of the silicon film 22 which corresponds to the PNP transistor after P- or As-doped polycrystalline silicon film is deposited.

Further, the above method can be applied not only to the case where a bipolar transistor is manufactured, but also to the case where, for example, a bipolar complementary MOS (BiCMOS) integrated circuit, in which a bipolar transistor and a metal oxide semiconductor (MOS) transistor are formed at the same time.

FIG. 4 is a schematic diagram showing the structure of a BiCMOS integrated circuit manufactured by using the method of the present invention. In this figure, structural elements similar to those shown in FIGS. 3A to 3G are designated by the same reference numerals, and the explanations therefor will be omitted. As shown in FIG. 4, an N-type buried layer 31, an N-type back gate region 32, P-type source-drain regions 33 and 34, and a gate electrode 35 which are formed on a P-type silicon substrate 10 constitute a pMOS transistor, whereas a P-type buried layer 41, an N-type back gate region 42, P-type source-drain regions 43 and 44, and a gate electrode 45 which are formed on the P-type silicon substrate 10 constitute an nMOS transistor. In the manufacture of this integrated circuit, a film similar to the B-doped polycrystalline silicon film 22 in the embodiment shown in FIGS. 3A to 3G is formed as in the same manner, and that parts of the film which correspond to the NPN transistor region and the NMOS region are changed to a P-doped polycrystalline silicon film by the same method as of the preceding embodiment. Consequently, the emitter diffusion regions 24 and 25, the source and drain regions 33 and 34, the source and drain regions 43 and 44 can be formed into appropriate shapes each having a uniform concentration, as shown in FIG. 4.

Naturally, as long as the essence of the invention remains unchanged, the present invention can be modified into various versions.

As described, according to the present invention, there can be provided a method of manufacturing a semiconductor device, in which two types of semiconductor regions having different conduction types can be formed at the same time in a few step, such as to have appropriate shape each having a uniform impurity concentration, and not only the variation but also the degradation of the characteristics of transistor caused by downsizing can be reduced.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a first insulating film on a semiconductor substrate;

making at least first and second holes by selectively removing part of said first insulating film;

forming a conductive film containing an impurity of a first conduction type, on said first insulation layer having said first and second holes made thereon;

forming a second insulating film on said conductive film;

exposing a predetermined portion of said conductive film which includes the second hole of said first and second holes, by selectively removing said second insulating film;

changing the exposed portion of said conductive film to a second conduction type, by diffusion of an impurity of the second conduction type; and forming a semiconductor region of the first conduction type and a semiconductor region of the second conduction type at the same time in a surface region of said semiconductor substrate, by diffusing the impurity of the first conduction type and the impurity of the second conduction type into said semiconductor substrate through said first and second holes formed in the insulating film.

2. A manufacturing method according to claim 1, wherein said step of changing the exposed portion of said conductive film to the second conduction type, and the step of forming the semiconductor region of the first conduction type and the semiconductor region of the second conduction type at the same time in the surface region of said semiconductor substrate, are carried out in one step.

3. A manufacturing method according to claim 2, wherein said one step is a vapor phase diffusion in which a thermal treatment is carried out in an atmosphere in which the impurity of the second conduction type is contained, so as to diffuse the impurity of the second conduction type into the exposed portion of the conductive film, and then the impurity of the second conduction type is diffused into the surface region of said semiconductor substrate through the second hole formed in the first insulating film.

4. A manufacturing method according to claim 2, wherein said one step is a solid phase diffusion in which a thermal treatment is carried out with deposition of a conductive film containing the impurity of the second conduction type, so as to diffuse the impurity of the second conduction type into the exposed portion of the conductive film, and then the impurity of the second conduction type is diffused into the surface region of said semiconductor substrate through the second hole formed in the first insulating film.

5. A method of manufacturing a semiconductor device, comprising the steps of:

selectively forming a collector region of a second conduction type in a first element region of a semiconductor substrate of a first conduction type, and a collector region of a first conduction type in a second element region thereof;

forming a base region of the second conduction type in the second element region on said semiconductor substrate, in which the collector region of the first conduction type is formed, and a base region of the first conduction type in the first element region in which the collector region of the second conduction type is formed;

forming a first insulating film on said semiconductor substrate;

forming emitter contact holes in portions of said first insulating film which correspond to an emitter region of the first conduction type formed in said second element region, and an emitter region of the second conduction type formed in said first element region;

forming a conductor film containing an impurity of the first conduction type, on said first insulating film having the holes therein;

forming a second insulating film on said conductor film;

exposing a portion of said conductor film which corresponds to a first element region in which the emitter region of the second conduction type is formed, by selectively removing said second insulating film;

performing a thermal treatment and diffusion of the impurity of the second conduction type while said portion of said conductor film is exposed, so as to change the impurity of the first conduction type contained in the exposed portion of said conductor film to an impurity of a second conduction type, and diffuse the impurity changed to the second conduction type into a surface region of said semiconductor substrate via the hole formed in the portion of said first insulating film which corresponds to the emitter region formed in said first element region, thereby forming the emitter region of the second conduction type in said first element region, and diffuse the impurity of the first conduction type contained in the non-exposed portion of said conductor film into the surface region of said semiconductor substrate via the hole formed in the portion of said first insulating film which corresponds to the emitter region formed in said second element region, thereby forming the emitter region of the first conduction type in said second element region.

* * * * *